(12) United States Patent  
Abraham et al.

(10) Patent No.: US 8,750,012 B1  
(45) Date of Patent: Jun. 10, 2014

(54) RACETRACK MEMORY WITH LOW-POWER WRITE

(71) Applicant: International Business Machines Corporation, Armonk, NY (US)

(72) Inventors: David W. Abraham, Croton, NY (US); Anthony J. Annunziata, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/734,642

(22) Filed: Jan. 4, 2013

(51) Int. Cl.
*G11C 19/00* (2006.01)
*G11C 19/08* (2006.01)
*G11C 11/00* (2006.01)
*G11C 11/14* (2006.01)
*G11C 11/15* (2006.01)

(52) U.S. Cl.
USPC ................. 365/80; 365/87; 365/88; 365/158; 365/171; 365/173

(58) Field of Classification Search
USPC ........................ 365/80, 87, 88, 158, 171, 173
See application file for complete search history.

(56) References Cited

U.S. PATENT DOCUMENTS

| | | | |
|---|---|---|---|
| 3,366,936 A | 1/1968 | Snyder | |
| 3,439,352 A | 4/1969 | Fischer | |
| 3,453,609 A | 7/1969 | Bonyhard et al. | |
| 6,834,005 B1 | 12/2004 | Parkin | |
| 6,898,132 B2 | 5/2005 | Parkin | |
| 6,955,926 B2 | 10/2005 | Chen et al. | |
| 7,031,178 B2 | 4/2006 | Parkin | |
| 7,108,797 B2 | 9/2006 | Chen et al. | |
| 7,236,386 B2 | 6/2007 | Parkin | |
| 7,416,905 B2 | 8/2008 | Chen et al. | |
| 7,551,469 B1 | 6/2009 | Parkin | |
| 7,598,097 B2 | 10/2009 | Chen et al. | |
| 7,755,921 B2 | 7/2010 | Assefa et al. | |
| 7,768,809 B2* | 8/2010 | Trouilloud | 365/158 |
| 7,808,814 B2* | 10/2010 | Togawa et al. | 365/158 |
| 7,843,719 B2 | 11/2010 | Hung et al. | |
| 8,064,246 B2 | 11/2011 | Slonczewski | |
| 8,203,191 B2 | 6/2012 | Uchida et al. | |
| 8,238,150 B2* | 8/2012 | Ohmori | 365/158 |
| 8,411,500 B2* | 4/2013 | Gapihan et al. | 365/158 |
| 8,456,895 B2* | 6/2013 | Abraham et al. | 365/158 |
| 8,467,235 B2* | 6/2013 | Slonczewski | 365/158 |
| 8,614,014 B2* | 12/2013 | Lee et al. | 365/87 |
| 2004/0252539 A1 | 12/2004 | Parkin | |
| 2009/0303631 A1 | 12/2009 | Rhie | |

(Continued)

OTHER PUBLICATIONS

Annunziata, A., et al. "Racetrack Memory Cell Array With Integrated Magnetic Tunnel Junction Readout" International Electron Devices Meeting—IEDM. Dec. 2011. pp. 24.3.1-24.3.4.

(Continued)

*Primary Examiner* — Trong Phan
(74) *Attorney, Agent, or Firm* — Tutunjian & Bitetto, P.C.; Vazken Alexanian

(57) ABSTRACT

Racetrack memory units and methods for writing include a racetrack memory medium; a heat source/sink configured to change temperature according to an applied current; and a magnon source material in contact with the racetrack memory medium and the heat source/sink, such that a temperature of the heat source/sink causes a magnon flow in the magnon source material that injects a domain wall in the racetrack memory medium.

8 Claims, 4 Drawing Sheets

(56) References Cited

U.S. PATENT DOCUMENTS

| | | |
|---|---|---|
| 2010/0002486 A1 | 1/2010 | Debrosse et al. |
| 2010/0046268 A1 | 2/2010 | Moriya et al. |
| 2010/0073984 A1 | 3/2010 | Xi et al. |
| 2010/0080034 A1 | 4/2010 | Hung |
| 2011/0026316 A1 | 2/2011 | Covington |

OTHER PUBLICATIONS

Parkin, S., et al. "Magnetic Domain-Wall Racetrack Memory" Science, vol. 320, No. 5873. Apr. 2008. pp. 190-194.

Slonczewski, J. "Initiation of Spin-Transfer Torque by Thermal Transport From Magnons" Physical Review, vol. 82. Aug. 2010. (11 Pages).

Thomas, L., et al. "Racetrack Memory: A High-Performance, Low-Cost, Non-Volatile Memory Based on Magnetic Domain Walls" 2011 International Electron Device Meeting, paper No. 24-2. Dec. 2011. (4 Pages).

Uchida, K., et al. "Thermal Spin Pumping and Magnon-Phonon-Mediated Spin-Seebeck Effect" Journal of Applied Physics, vol. 111, Issue 10. May 2012. (13 Pages).

\* cited by examiner

RACETRACK MEMORY WITH LOW-POWER WRITE

BACKGROUND

1. Technical Field

The present invention relates to memory devices and, more particularly, to writing magnetic domains to racetrack memory using heating or cooling to generate magnons.

2. Description of the Related Art

Racetrack memory offers high storage densities and high read/write performance by encoding data in walls between magnetic domains along a nanowire. Stored domains are pushed through the memory using a spin-coherent electric current, which moves all domain walls in a consistent direction, regardless of the direction of its particular magnetization.

The injection of domain walls into a magnetic nanowire at specific locations conventionally is accomplished using magnetic fields applied by adjacent current-carrying wires. Such wires are usually disposed perpendicular to the magnetic nanowire. This method of injection uses large currents to generate the necessary magnetic field, which necessitates the use of large amounts of power and large on-chip transistors.

Another injection method uses spin-torque transfer from a spin-polarized current passing from a second ferromagnetic conductor into the magnetic nanowire through a non-magnetic, insulating tunnel barrier. This method injects domains by flipping the magnetization of the nanowire locally. This method also uses relatively large currents and is furthermore susceptible to breakdown of the insulating tunnel barrier between the magnetic nanowire and the ferromagnetic conductor.

SUMMARY

A racetrack memory unit is shown that includes a racetrack memory medium; a heat source/sink configured to change temperature according to an applied current; and a magnon source material in contact with the racetrack memory medium and the heat source/sink, wherein a temperature of the heat source/sink causes a magnon flow in the magnon source material that injects a domain wall in the racetrack memory medium.

A method for writing to a racetrack memory unit is shown that includes applying a current pulse to a racetrack memory medium to position a domain in proximity to a thermally triggered magnon source in contact with the racetrack memory medium; activating a heat source/sink in contact with the magnon source to generate a magnon flow in the magnon source; and changing a magnetization in the racetrack memory medium by spin torque transfer from the magnon flow.

A method for forming a racetrack memory unit is shown that includes forming a heat source/sink on a substrate; forming a magnon source material in contact with the heat source/sink; forming a dielectric layer around the heat source/sink and the magnon source material; forming a racetrack memory medium on the dielectric layer, in contact with the magnon source material; forming a magnetic tunnel junction in contact with the racetrack medium; extending the dielectric layer around the racetrack medium and the magnetic tunnel junction; and forming a readout wire in contact with the magnetic tunnel junction.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide the ability to write to racetrack memory using a low-power heat source or heat sink to generate magnons. The magnons propagate to the racetrack memory, causing a magnetization change, thereby injecting a domain wall.

Addressing the physics behind this phenomenon first, the transfer of spin momentum driven by electric current, flowing either through a tunnel barrier or a metallic spacer, creates pseudotorques on the macroscopic spin moments of magnetic electrodes. Thermal effects can be used to transfer spin momentum from a thermally generated magnon concentration existing within an electrically insulating ferromagnet or ferrimagnet, through a normal metal, and into a free magnet. These thermal magnons are an alternative to conventional spin transportation by conducting electrons in a magnetic material.

One property of magnons is that, unlike electrons, they may be created and annihilated at an interface with a metal, along with a transfer of heat energy. The spin density is conserved through this process. As a result, the creation or annihilation of magnons at an interface between a ferrite and a metal transfers the magnon's spin momentum into spin current within the metal.

Figure 1:
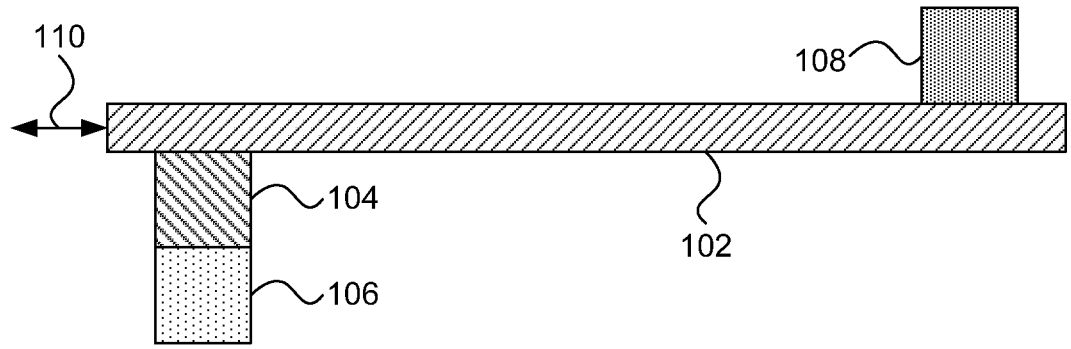
FIG. 1 is a cross-sectional view of a thermally triggered racetrack memory in accordance with the present principles.

Referring now to the drawings in which like numerals represent the same or similar elements and initially to FIG. 1, a racetrack memory writing device is shown. A racetrack memory medium 102 is formed from, e.g., a nanowire of ferromagnetic material. The medium 102 may be formed from any suitable ferrous material with a sufficiently high magnetic permeability. In particular it is contemplated that the medium 102 may be a nanowire of permalloy formed from nickel and iron about 200 nm across and about 10 nm thick. A spin-coherent electric current 110 is applied to the medium 102, which causes magnetic domains in the medium 102 to shift. In this embodiment, a magnetic tunnel junction 108 is used to read out magnetic domain walls to determine a stored bit. Alternative embodiments may use any appropriate solid magnetic sensor to read out the domain wall orientation. Examples of such sensors include a giant magnetoresistance device and an inductive element which registers a voltage pulse when a domain passes nearby.

The stored information may be read out sequentially in either direction, as the current 110 can be reversed to change the direction of magnetization domain motion. In a magnetic material with domain walls, a current passed across the domain walls moves the domain walls in the same direction regardless of the polarity of the domain walls. As the current passes through a domain, it becomes spin-polarized. When the spin-polarized current passes into the next domain across the intervening domain wall, it develops a spin torque. This spin torque moves the domain wall. The domain walls can be moved in the same direction or in the opposite direction as the current flow depending on the details of the physics of the spin torque transfer, which depends on materials and interface properties. Domain wall velocities can be very high, so that the process of moving a particular domain to the required position for the purposes of reading the domain or for changing its state can be very short.

Information is written to the medium 102 by applying a heat source or heat sink 106 to a magnon-producing material 104. This magnonic material 104 may be any appropriate material, such as ferrite. As heat is applied or removed from the magnonic material 104 by heat sink/source 106, spin waves known as "magnons" are generated within the magnonic material 104 that flow from a region of higher temperature in the direction of a region of lower temperature. The magnons flow to the interface between the magnon material 104 and the medium 102, at which point the magnons are annihilated. Conservation properties cause the spin angular momentum carried by the magnons to continue in the medium 102 as a spin current, thereby causing a change in magnetization. The change in local magnetization takes place along a defined anisotropy direction that can be, for example, in-plane or perpendicular to a plane of the magnetic medium 102.

The heat source/sink 106 may be a conductive material that generates heat when current is passed through it. In this case, heat only flows from the heat source into the racetrack nanowire. The heat source/sink 106 may further incorporate some form of active heating or cooling that allows for a rapid increase or decrease in temperature, thereby causing magnons to flow into or out of the racetrack nanowire. Particular timing considerations are taken into account in the heat source/sink 106, as a certain amount of time is needed for the generation and propagation of thermal magnons within the magnon material 104. Heating and cooling is therefore timed to produce magnons at the medium 102 when the domain walls within the medium 102 have moved to the correct position to be written. This is distinct from conventional memory devices, where random access is possible and thermal timing is unimportant.

Magnons are generated within the magnon material 104 continuously as a function of input temperature gradient. However, just as with electronic spin-generated current, there is a threshold for an amount of magnon flow needed to inject a domain wall. The heat source/sink 106 may be tuned to operate near the threshold, such that writing may be turned off simply by turning off a heating function. For a sufficiently small heat source 106, the thermal gradient will dissipate quickly.

It should be recognized that heat source/sink 106 may include a thermoelectric device that performs active cooling by way of the Peltier-Seebeck effect. Such a device provides electrical transport of heat away from the magnon material 104 with the application of an appropriate voltage. Such a thermoelectric device may be formed with thin films of Nb-doped strontium titanate with two wires having a high heat endurance, e.g., tungsten, TaN, TiN, or molybdenum. An alternative thermoelectric device might include two or more different Peltier materials, one N-type and one P-type. This dual-Peltier embodiment of the heat source/sink 106 increases the efficiency of heating/cooling, at the expense of additional size and complexity.

Figure 2:
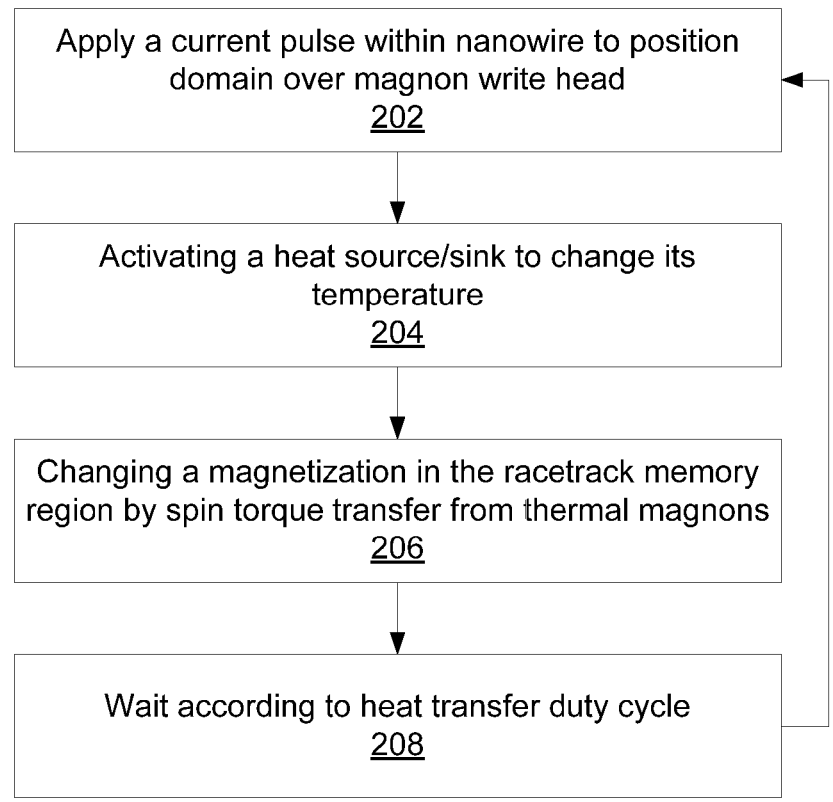
FIG. 2 is a block/flow diagram of a method for writing to a thermally triggered racetrack memory in accordance with the present principles.

Referring now to FIG. 2, a method for writing to racetrack memory is shown. Block 202 applies a current pulse 110 to the medium 102 to shift the magnetic domain to be written over the magnonic write head 104. Because the medium 102 is kept at or about room temperature, the magnonic write head 104 can be heated or cooled to write a bit purely based on whether the intended bit is a '1' or a '0'. Block 204 activates the heat source/sink 106 to change its temperature according to a desired bit. As described above, the temperature of magnonic write head 104 causes magnons to be generated, injecting a domain wall in the medium 102, thereby writing to the memory in block 206 via spin torque transfer.

It should be noted that the write operation can't be pushed faster than the time scale of the heat source/sink 106—heat transfer times are a particularly relevant to how quickly information can be written. For nanoscale devices, the heat transfer time can be in the nanosecond regime or better, but for a lithographically defined heater it can be substantially longer, depending on element size. Furthermore, if the heat source/sink 106 itself is partially thermally isolated from the chip as a whole, then repeated heatings may cause the heat sink itself to rise in temperature. By reducing the duty cycle sufficiently, the heat sink temperature will return to ambient. Therefore, block 208 pauses according to this duty cycle. This duty cycle includes the above two factors: a time lag for thermally generating and transferring magnons to the medium 102 and a time lag for allowing the heat source/sink 106 to return to an ambient temperature.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 3:
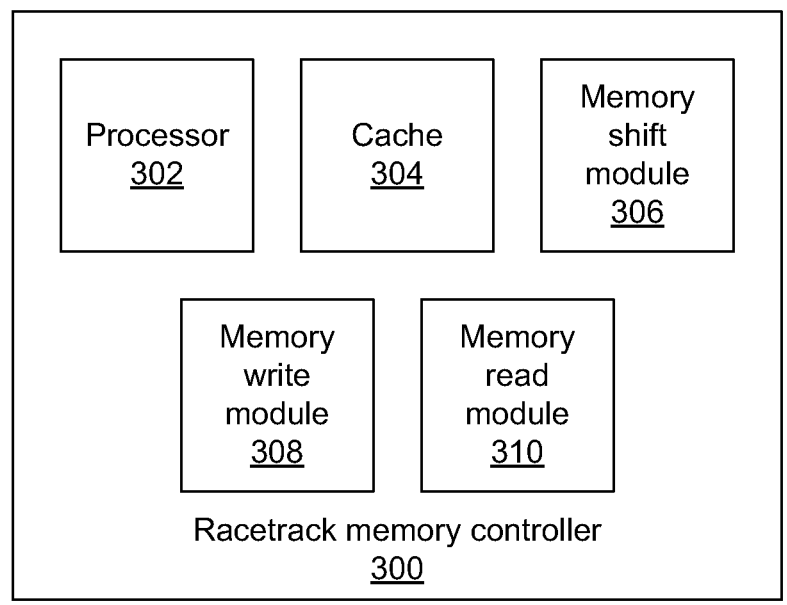
FIG. 3 is a diagram of a racetrack memory controller in accordance with the present principles.

Referring now to FIG. 3, a racetrack memory controller 300 is shown. A processor 302 operates memory shift module 306, memory write module 308, and memory read module 310, writing bits from and reading bits into memory cache 304. The memory shift module 306 controls the position of the racetrack memory register by applying a current to the medium 102 to position a desired magnetization region near the write head 104 or the read head 108. Memory write module 308 controls the temperature of heat source/sink 106, which causes magnon flow in the magnonic material 104 to write to an adjacent region of the medium 102. Memory read module 310 operates the read head 108 to detect a local magnetization in the medium 102 and determine a stored bit at a given location.

Figure 4:
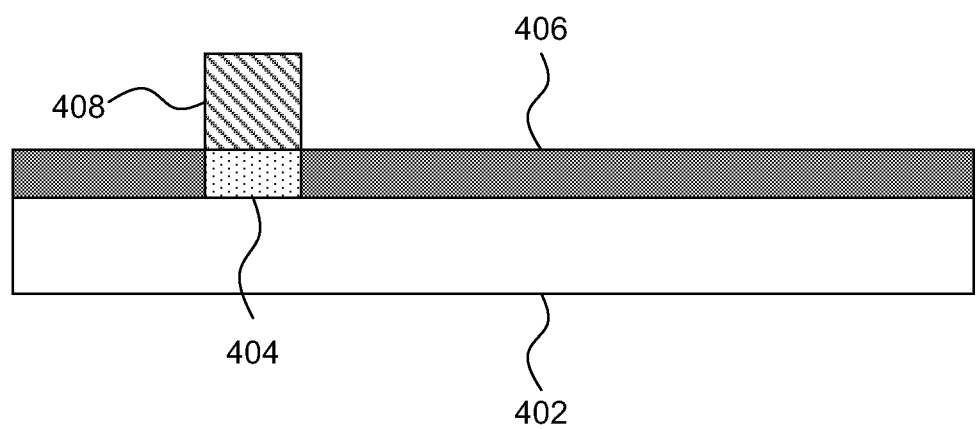
FIG. 4 is a diagram of a step in the formation of a thermally triggered racetrack memory in accordance with the present principles.

Referring now to FIG. 4, a step in forming a thermally triggered racetrack memory system is shown. A substrate 402 is formed from any appropriate material. The substrate may include, e.g., silicon or an appropriate dielectric material such as silicon dioxide. A dielectric layer 406 is formed on the substrate 402 with a heat source/sink 404 that may be, e.g., a simple conducting wire or may be an active heater/cooler as described above. A magnon source material 408 is patterned as an island in contact with and above a metal surface of heat source/sink 404. The heat source/sink 404 is the source of current for heating the magnonic electrode 408 and/or field for writing, and is encapsulated in dielectric material 406. The formation of the magnon material 408 may entail high-temperature processing (e.g., higher than 500 degrees Celsius), for example if the magnonic material 408 is ferrite, such that the material of the heat source/sink 404 should have a high heat endurance.

Figure 5:
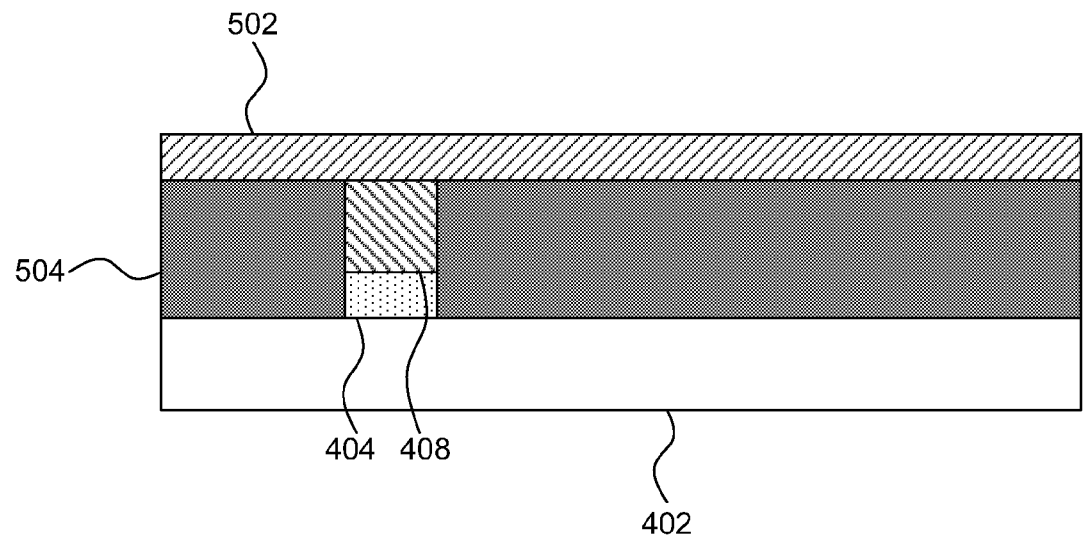
FIG. 5 is a diagram of a step in the formation of a thermally triggered racetrack memory in accordance with the present principles.

Referring now to FIG. 5, a further step in forming a thermally triggered racetrack memory system is shown. The dielectric layer 504 is extended to encapsulate the magnon source material 408 and a racetrack memory medium 502 is formed in contact with the magnonic source material 408. The formation of the racetrack medium 502 may take place at a significantly lower temperature than the formation of the magnonic material 408.

Figure 6:
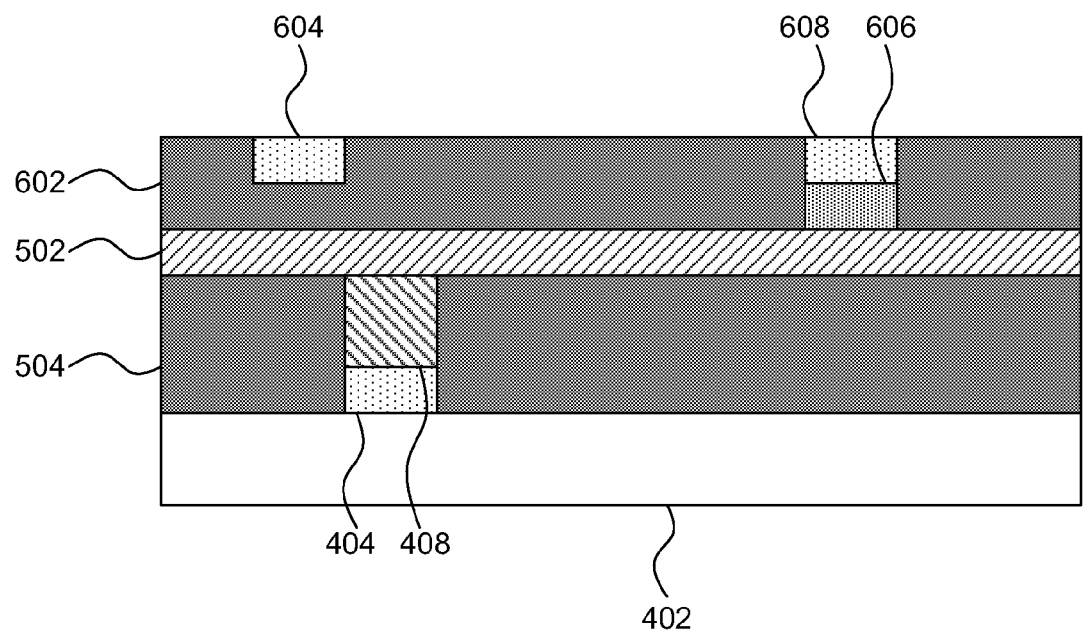
FIG. 6 is a diagram of a step in the formation of a thermally triggered racetrack memory in accordance with the present principles.

Referring now to FIG. 6, a magnetic tunnel junction 606 is formed on the racetrack medium 502, a readout wire 608 is formed on the magnetic tunnel junction 606, and a dielectric layer 602 is formed encapsulating both. In an alternative embodiment, a third wire 604 may be formed in the dielectric layer 602. The addition of wire 604 allows for the use of magnetic fields to assist the injection of a domain wall by magnon spin transfer to the racetrack medium 502. The wire 604 is advantageously offset from the heat source/sink 404. In this fashion, the combined magnetic field of the heat source/sink 404 and the wire 604 may be manipulated to provide control over the direction and strength of the magnetic field at the junction of the magnonic material 408 and the racetrack medium 502.

Figure 7:
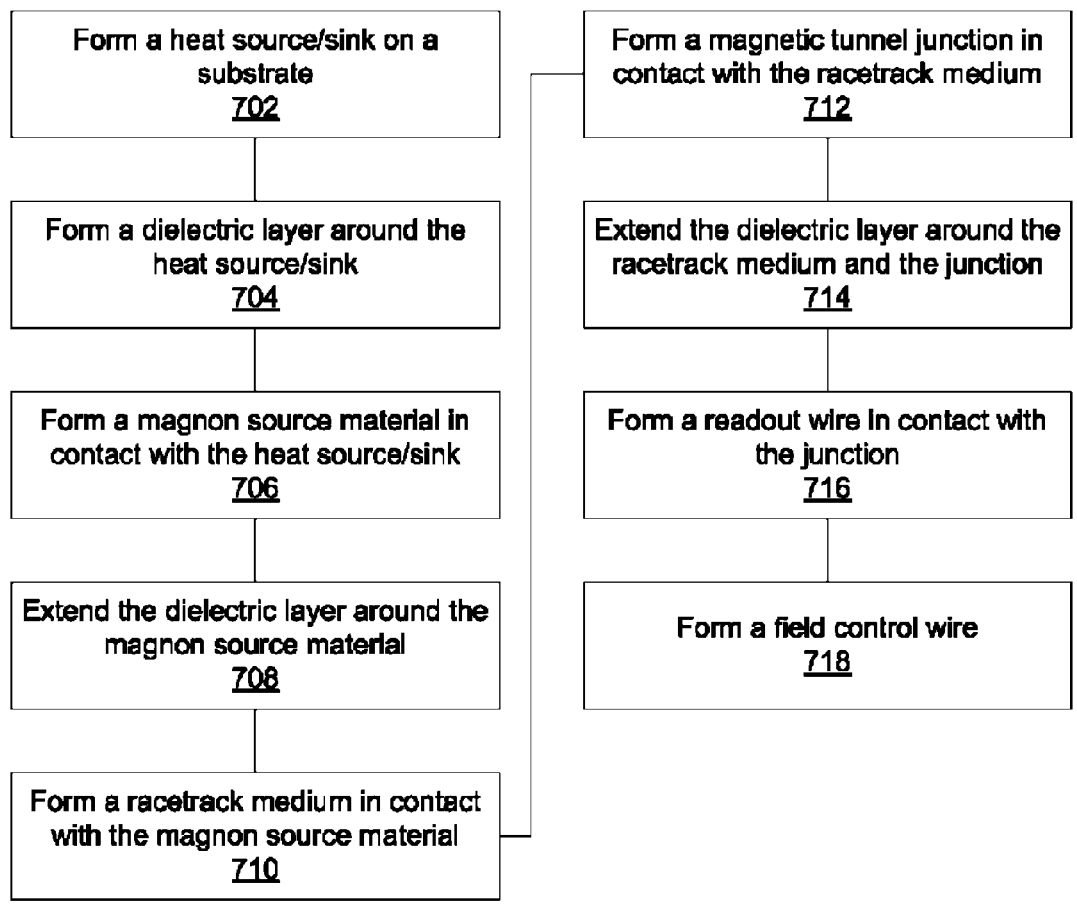
FIG. 7 is a block/flow diagram of a method of forming a thermally triggered racetrack memory in accordance with the present principles.

Referring now to FIG. 7, a method for forming a thermally triggered magnon-write racetrack memory is shown. Block 702 forms a heat source/sink 404 on a substrate 402. As described in detail above, the heat source/sink 404 may be a simple wire or may include active cooling such as Peltier thermoelectric materials. Block 704 forms a dielectric material 402 around the heat source/sink 404. The dielectric material may include, e.g., silicon dioxide or any other appropriate dielectric. Block 706 forms a magnon source material 408, such as ferrite, in contact with the heat source/sink 404. The formation of magnon source material 408 may be at a high temperature, such that the material used to form the heat source/sink 404 will need a correspondingly high temperature endurance.

Block 708 extends the dielectric layer 504 around the magnon source material 408 and planarizes both to form a flat surface. Block 710 forms a racetrack medium 502 in contact with the magnon source material 408. The racetrack medium 502 may be formed from a nanowire of suitable ferromagnetic material. Block 712 forms a magnetic tunnel junction 606 in contact with the racetrack medium 502, forming the read sensor of the memory. Block 714 extends the dielectric material 602 around the medium 502 and junction 606.

Block 716 forms a readout wire 608 in the dielectric material 602 in contact with the junction 606. Block 718 forms another wire 604 in the dielectric material 602, allowing for greater control over the strength and direction of the magnetic field at the contact point of the magnon source material 408 with the racetrack medium 502.

Having described preferred embodiments of a system and method for racetrack memory with low-power writing (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A racetrack memory unit, comprising:
a racetrack memory medium;
a magnonic source material in contact with the racetrack memory medium, wherein a temperature of the heat source/sink causes a magnon flow in the magnon source material that injects a domain wall in the racetrack memory medium; and
a heat source/sink, in contact with the magnonic material, configured to change temperature according to an applied current.

2. The racetrack memory unit of claim 1, wherein the heat source/sink comprises a heating element that adds heat to the magnonic source material in response to the applied current and dissipates heat into surrounding structures, creating a thermal gradient in the magnonic source material.

3. The racetrack memory unit of claim 1, wherein the heat source/sink comprises an active heating and cooling material that adds or removes heat from the magnonic source material in response to an applied voltage, creating a thermal gradient in the magnonic source material.

4. The racetrack memory unit of claim 1, wherein magnon flow that reaches an interface between the magnon source material and the racetrack memory medium annihilates and induces a spin current in the racetrack memory medium.

5. The racetrack memory unit of claim 1, further comprising a magnetic field control element configured to control the strength and direction of a magnetic field at an interface between the magnon source material and the racetrack memory medium.

6. The racetrack memory unit of claim 5, further comprising a memory write control module configured to coordinate a current applied to the heat source/sink with a current applied to the magnetic field control element to write information to the racetrack memory medium.

7. The racetrack memory unit of claim 6, wherein the memory write control module is further configured to wait a period of time based on a heat transfer duty cycle.

8. The racetrack memory unit of claim 5, wherein the magnetic field control element is horizontally and vertically displaced from the heat source/sink.

* * * * *